(12) United States Patent
Qian

(10) Patent No.: US 9,130,003 B2
(45) Date of Patent: Sep. 8, 2015

(54) STRUCTURE FOR PICKING UP A COLLECTOR AND METHOD OF MANUFACTURING THE SAME

(71) Applicant: SHANGHAI HUA HONG NEC ELECTRONICS CO., LTD, Shanghai (CN)

(72) Inventor: Wensheng Qian, Shanghai (CN)

(73) Assignee: SHANGHAI HUA HONG NEC ELECTRONICS, Shanghai (CN)

( * ) Notice: Subject to any disclaimer, the term of this patent is extended or adjusted under 35 U.S.C. 154(b) by 134 days.

(21) Appl. No.: 13/899,858

(22) Filed: May 22, 2013

(65) Prior Publication Data

US 2013/0328047 A1  Dec. 12, 2013

(30) Foreign Application Priority Data

May 23, 2012  (CN) .......................... 2012 1 0163783

(51) Int. Cl.
*H01L 29/732* (2006.01)
*H01L 29/73* (2006.01)
*H01L 29/66* (2006.01)
*H01L 29/737* (2006.01)
*H01L 29/08* (2006.01)
*H01L 21/763* (2006.01)
*H01L 29/417* (2006.01)

(52) U.S. Cl.
CPC ............ *H01L 29/73* (2013.01); *H01L 29/0821* (2013.01); *H01L 29/66234* (2013.01); *H01L 29/66242* (2013.01); *H01L 29/7378* (2013.01); *H01L 21/763* (2013.01); *H01L 29/41708* (2013.01)

(58) Field of Classification Search
CPC ................ H01L 29/0821; H01L 29/73; H01L 29/41708; H01L 21/763
USPC .......................................... 257/588; 438/343
See application file for complete search history.

(56) References Cited

U.S. PATENT DOCUMENTS

| | | | | |
|---|---|---|---|---|
| 5,003,365 A | * | 3/1991 | Havemann et al. ............ | 257/514 |
| 5,877,539 A | * | 3/1999 | Yamazaki ...................... | 257/514 |
| 6,066,520 A | * | 5/2000 | Suzuki .......................... | 438/202 |
| 2001/0012655 A1 | * | 8/2001 | Nordstom et al. ............. | 438/239 |
| 2002/0158311 A1 | * | 10/2002 | Ohnishi et al. ................ | 257/591 |
| 2003/0186516 A1 | * | 10/2003 | Notake et al. ................. | 438/478 |
| 2003/0193077 A1 | * | 10/2003 | Fujii ............................. | 257/656 |
| 2004/0092076 A1 | * | 5/2004 | Idota et al. .................... | 438/311 |
| 2004/0157387 A1 | * | 8/2004 | Yi et al. ........................ | 438/202 |
| 2004/0212034 A1 | | 10/2004 | Mochizuki et al. | |
| 2006/0011943 A1 | * | 1/2006 | Howard ........................ | 257/197 |
| 2006/0076629 A1 | * | 4/2006 | Yilmaz ......................... | 257/378 |
| 2007/0085167 A1 | * | 4/2007 | Saitoh et al. .................. | 257/565 |
| 2011/0140233 A1 | | 6/2011 | Qian et al. | |
| 2011/0156202 A1 | | 6/2011 | Chiu et al. | |
| 2013/0092939 A1 | * | 4/2013 | Kim ................................ | 257/51 |
| 2013/0126945 A1 | | 5/2013 | Liu et al. | |

* cited by examiner

*Primary Examiner* — Steven J Fulk
(74) *Attorney, Agent, or Firm* — MKG LLC

(57) ABSTRACT

A structure for picking up a collector region including a pair of polysilicon stacks formed in the isolation regions and extending below the collector region; and a pair of collector electrodes contacting on the polysilicon stacks, wherein the pair of polysilicon stacks includes: an undoped polysilicon layer and a doped polysilicon layer located on the undoped polysilicon layer, wherein a depth of the doped polysilicon layer is greater than a depth of the collector region; the depth of the collector region is greater than a depth of the isolation regions.

10 Claims, 7 Drawing Sheets

STRUCTURE FOR PICKING UP A COLLECTOR AND METHOD OF MANUFACTURING THE SAME

CROSS-REFERENCES TO RELATED APPLICATIONS

This application claims the priority of Chinese patent application number 201210163783.6, filed on May 23, 2012, the entire contents of which are incorporated herein by reference.

TECHNICAL FIELD

This disclosure pertains generally to a structure for picking up a collector region, and in particular, to a structure for picking up a collector region of a heterojunction bipolar transistor (HBT). The disclosure also relates to a method for manufacturing the structure for picking up a collector region.

BACKGROUND

Silicon-germanium (SiGe) is a semiconductor compound consisting of covalently bonded silicon and germanium atoms. It is a substitution solid solution of the two elements that can infinitely dissolve into each other. SiGe heterojunction bipolar transistors (HBTs) manufactured by using SiGe materials have become a kind of commonly used radio frequency (RF) devices.

Chinese patent application Number 201110370460.X, entitled "Ultra-high Voltage SiGe HBT and Manufacturing Method Thereof", filed on Nov. 21, 2011, claims an ultra-high voltage SiGe HBT, as schematically illustrated in FIG. 1.

In a substrate 101, there are formed two isolation structures 102, two pseudo buried layers 103 and a collector region 104. The isolation structures 102 are formed by etching the substrate 101 to form trenches therein and filling a dielectric material into the trenches. The pseudo buried layers 103 are two doped regions each formed under a corresponding isolation structure 102. The pseudo buried layers 103 are formed by implanting ions into the bottoms of the trenches with a high dose and a low energy, and characterized in a shallow junction and a high dopant concentration. The collector region 104 is a doped region located between the two isolation structures 102 and between the two pseudo buried layers 103 as well. It is formed by implanting ions into a portion of the substrate 101 that is sandwiched between the isolation structures 102. Additionally, the collector region 104 has a depth greater than that of the isolation structure 102 and is in contact with the pseudo buried layer 103 on each side of it. A SiGe base region 105 is formed on the collector region 104. The SiGe base region 105 has its two ends above the respective isolation structures 102 that are adjacent to the collector region 104 or has its two ends both situated above the collector region 104. A SiGe field plate 106 is formed on each of the isolation structures 102, and is located right above a border of the collector region 104 and a corresponding one of the pseudo buried layers 103. Moreover, both the SiGe base region 105 and the SiGe field plates 106 are formed by growing a SiGe epitaxial layer and etching it. Dielectric layers 107 and a polysilicon emitter region 108 are formed above the SiGe base region 105. The polysilicon emitter region 108 has a T-shaped vertical cross section (i.e., broader at the top and narrower at the bottom) and is in contact with the SiGe base region 105 at the bottom. The dielectric layers 107 are formed between the SiGe base region 105 and extending portions of the polysilicon emitter region 108. Each side face of the SiGe base region 105 and each side face of each SiGe field plate 106 is covered with a first sidewall 109. In addition, each side face of the polysilicon emitter region 108 is covered with a second sidewall 110. A first electrode 111 is formed through an interlayer dielectric (ILD) layer as well as a corresponding isolation structure 102 and is in contact with a corresponding one of the pseudo buried layers 103. Moreover, second electrodes 112, third electrodes 113 and a fourth electrode 114 are formed through the ILD layer and are in contact with a corresponding one of the SiGe field plates 106, the SiGe base region 105 and the polysilicon emitter region 108. Furthermore, each first electrode 111 is interconnected with a corresponding second electrode 112, and they jointly serve as a collector. Each third electrode 113 serves as a base, and the fourth electrode 114 serves as an emitter.

In this ultra-high voltage SiGe HBT, each pair of a pseudo buried layer 103 and a corresponding first electrode 111 serves as a structure for picking up the collector region. A base-collector (BC) junction (i.e., the PN junction between the SiGe base region 105 and the collector region 104) is characterized in a two-dimensional potential distribution. That is, the BC junction has not only a vertical extension in the downward direction from the SiGe base region 105 to the substrate 101, but also horizontal extensions in the lateral directions from the SiGe base region 105 to the respective pseudo buried layers 103. This feature improves the breakdown voltage in common-emitter configuration, Bvceo, of the device up to 5 volts to 20 volts. For this reason, the device is referred to as an "ultra-high voltage" SiGe HBT device.

Nevertheless, this device has a drawback that, as each pseudo buried layer 103 is a doped region below the isolation structure 102 formed by performing an ion implantation process with a low energy and a high dose at bottom of a corresponding one of the trenches and has a shallow junction and a high doping concentration, it is difficult to lower the parasitic capacitance Ccs between the pseudo buried layer 103 and the substrate 101, and as a result, the RF power characteristics of the device will be affected.

SUMMARY OF THE INVENTION

The present invention overcomes the aforementioned drawback of the conventional structure by presenting a novel structure for picking up a collector region of a heterojunction bipolar transistor (HBT). The structure is capable of reducing a parasitic capacitance between the structure for picking up a collector region and the substrate. In addition, the present invention also provides a method of manufacturing the structure for picking up a collector region of a HBT.

A first aspect of the present invention provides a structure for picking up a collector region that is formed in a substrate and sandwiched between two isolation regions, the structure including: a pair of polysilicon stacks formed in the isolation regions and extending below the collector region, the pair of polysilicon stacks comprising an undoped polysilicon layer and a doped polysilicon layer located on the undoped polysilicon layer, the doped polysilicon layer having an opposite conductivity type to a conductivity type of the substrate; and a pair of collector electrodes contacting on the polysilicon stacks, wherein a depth of the collector region is smaller than a depth of the doped polysilicon layer and greater than a depth of the isolation regions, the doped polysilicon layer having a side face contacting with the collector region.

In a preferred embodiment, the structure further comprises an intermediate layer formed between the undoped polysilicon layer and the doped polysilicon layer.

In a preferred embodiment, the doped polysilicon layer has a depth great enough to ensure a relatively low parasitic capacitance between the doped polysilicon layer and the substrate.

A second aspect of the present invention provides a method of forming such a structure for picking up a collector region, the method including: forming two isolation regions in a substrate, the isolation regions isolating an active region therebetween; forming a trench through each of the isolation regions, each trench extending below the isolation regions; depositing an undoped first polysilicon to completely fill the trenches; removing a portion of the first polysilicon in an upper portion of each trench so that the remaining first polysilicon serves as the undoped polysilicon layer; depositing a second polysilicon to form the doped polysilicon layer in the upper portion of each trench; forming a collector region between the two isolation regions, both sides of the collector region contacting a first side face of the doped polysilicon layer, a depth of the collector region being smaller than a depth of the doped polysilicon layer and greater than a depth of the isolation regions; and forming collector electrodes contacting on the doped polysilicon layer.

A third aspect of the present invention provides another method of forming such a structure for picking up a collector region, the method including: forming two isolation regions in a substrate, the isolation regions isolating an active region therebetween; forming a trench through each of the isolation regions, each trench extending below the isolation regions; depositing an undoped first polysilicon to completely fill the trenches; removing a portion of the first polysilicon in an upper portion of each trench so that the remaining first polysilicon serves as the undoped polysilicon layer; depositing an intermediate dielectric layer in the trenches to form an intermediate layer; depositing a second polysilicon to completely fill the trenches to form the doped polysilicon layer in the upper portion of each trench; forming a collector region between the two isolation regions, both sides of the collector region contacting a first side face of the doped polysilicon layer, a depth of the collector region being smaller than a depth of the doped polysilicon layer and greater than a depth of the isolation regions; and forming collector electrodes contacting on the doped polysilicon layer.

As indicated above, in the structure of the present invention, the undoped polysilicon layer may serve as a depletion region between the doped polysilicon layer and the substrate under a reverse bias, and thereby may significantly reduce the parasitic capacitance between the doped polysilicon layer and the substrate. Moreover, as the doped polysilicon layer connecting the collector region and the collector electrodes has a doping concentration higher than the collector region, the series resistance of the collector region and hence the saturation voltage drop of the device can be greatly reduced, on the other hand, a good ohmic contact can be formed between the doped polysilicon layer and the collector electrodes.

Furthermore, the intermediate layer optionally formed between the undoped and doped polysilicon layers may prevent the impurity in the doped polysilicon layer from diffusing into the undoped polysilicon layer, thus the undoped polysilicon layer is substantially an intrinsic polysilicon, which is more favorable to serve as a depletion region between the doped polysilicon layer and the substrate under a reverse bias to reduce the parasitic capacitance between the doped polysilicon layer and the substrate.

BRIEF DESCRIPTION OF THE DRAWINGS

FIGS. 2b to 2c show alternative embodiments of the polysilicon stacks 300 of FIG. 2a.

DETAILED DESCRIPTION

Figure 2A:
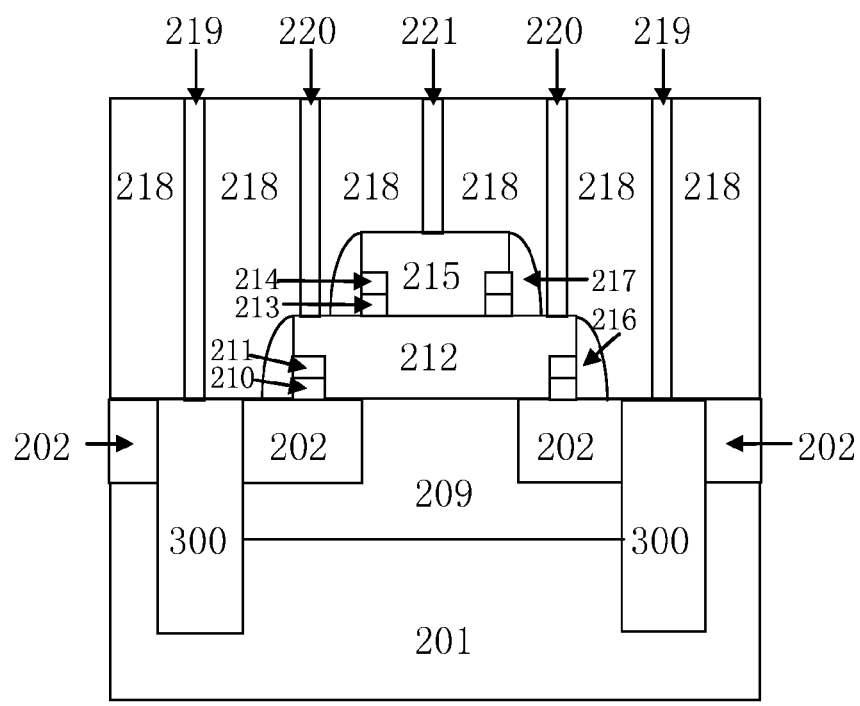
FIG. 2a schematically illustrates a vertical cross section of an ultra-high voltage SiGe HBT in accordance with embodiments of the present invention.

Referring to FIG. 2a, a structure for picking up a collector region of an ultra-high voltage SiGe HBT in accordance with embodiments of the present invention includes two polysilicon stacks 300 which are symmetrically formed in two isolation regions 202, and each of the polysilicon stacks 300 has a lower portion extending downward into a semiconductor substrate 201. The isolation regions 202 are located beneath a top surface of the substrate 201 for isolating an active region therebetween, namely the isolation regions 202 are symmetrically distributed on both sides of the active region.

Figure 2B:
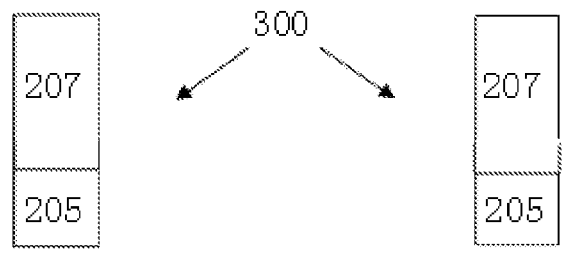

As shown in FIG. 2b, each polysilicon stack 300 comprises an undoped polysilicon layer 205 and a doped polysilicon layer 207 that is located on and in contact with the undoped polysilicon layer 205. The doped polysilicon layer has an opposite doping type to a conductivity type of the substrate 201. The collector region 209 is located between the two isolation regions 202 and also between the two polysilicon stacks 300. The collector region 209 has a T-shaped vertical cross section. Moreover, due to being sandwiched between the isolation regions 202, an upper portion of the collector region 209 is narrower than the lower portion. In addition, both sides of the collector region 209 are in contact with a side face of a corresponding doped polysilicon layer 207. A depth of the collector region 209 is smaller than a depth of the doped polysilicon layer 207 and greater than a depth of the isolation regions 202.

The structure embodying the present invention further comprises collector electrodes 219 formed in an interlayer dielectric (ILD) layer 218. Each of the collector electrodes 219 has a bottom end that is in contact with a top end of a corresponding one of the polysilicon stacks 300.

In addition to the structure described above, the ultra-high voltage SiGe HBT of FIG. 2a further comprises the conventional structures as follows: a SiGe base region 212 covering the collector region 209 as well as a portion of each isolation region 202 that is adjacent to the collector region 209, the SiGe base region 212 having a T-shaped vertical cross section; a stack of a third polysilicon layer 211 and a second dielectric layer 210 under each of two opposite extending portions of the SiGe base region 212; a polysilicon emitter region 215 on the SiGe base region 212, the polysilicon emitter region 215 also having a T-shaped vertical cross section; a stack of a fourth dielectric layer 214 and a third dielectric layer 213 under each of two opposite extending portions of the polysilicon emitter region 215; base-region sidewall spacers 216 each formed on a corresponding isolation region 202 and covering a corresponding side face of the SiGe base region 212; emitter-region sidewall spacers 217 each formed on the SiGe base region 212 and covering a corresponding side face of the polysilicon emitter region 215; the ILD layer 218 formed over all the foregoing structures; collector electrodes 219 connecting to the respective polysilicon stacks 300; base electrodes 220 connecting to the SiGe base region 212; and an emitter electrode connecting to the polysilicon emitter region 215.

Each of the isolation regions 202, the second dielectric layers 210, the third dielectric layers 213, the fourth dielectric layers 214, the base-region sidewall spacers 216, the emitter-region sidewall spacers 217 and the ILD layer 218 may be formed of one or more dielectric materials selected from the group consisting of silicon oxide, silicon nitride and silicon oxynitride.

Please refer to FIGS. 2a and 2b, each of the doped polysilicon layers 207, which forms an upper portion of the polysilicon stack 300, is a lateral distance from the SiGe base region 212. Moreover, the farther the doped polysilicon layers 207 are away from the boundaries of the active region (i.e., the portion of the substrate between the two isolation regions 202), the higher a breakdown voltage the device has, and vice versa. Moreover, the deeper the polysilicon stacks 300 are, the smaller the parasitic capacitance between the doped polysilicon layer 207 and the substrate 201 can be achieved, and vice versa.

Figure 2C:
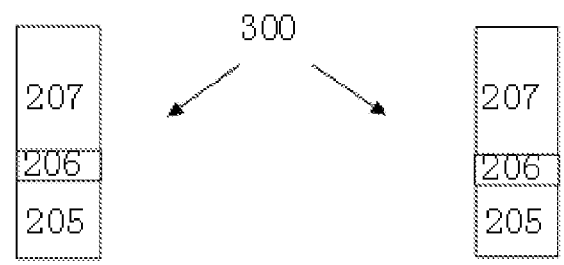

FIG. 2c shows another embodiment of the polysilicon stacks 300. The pair of polysilicon stacks 300 comprises an undoped polysilicon layer 205, a doped polysilicon layer 207 and an intermediate layer 206 connecting the above two layers. The intermediate layer 206 is used to isolate the undoped polysilicon layer 205 from the doped polysilicon layer 207 to prevent the impurity in the doped polysilicon layer 207 from diffusing into the undoped polysilicon layer 205 during a thermal process so as to reduce the vertical parasitic capacitance between the doped polysilicon layer 207 and the substrate 201. Therefore a thickness of the intermediate layer 206 shall be controlled in a range such that the impurity in the doped polysilicon layer 207 may not pass through the intermediate layer 206 during a thermal process. Besides, the intermediate layer 206 can also be used to precisely control the depth of an extension portion of the doped polysilicon layer 207 below the isolation regions 202 to ensure a relatively low lateral parasitic capacitance between the doped polysilicon layer 207 and the substrate 201.

Compared with the conventional structure, the present invention is capable of reducing a parasitic capacitance between the structure for picking up a collector region and the substrate. Reasons are as follows.

First, the undoped polysilicon layer 205 serves as a depletion region between the substrate 201 and the doped polysilicon layer 207 under a reverse bias; as the undoped polysilicon layer 205 has a certain thickness, the parasitic capacitance between the doped polysilicon layer 207 and the substrate 201 is significantly reduced.

Second, the doped polysilicon layer 207 is connected with the collector region 209 to serve as an external collector region and the doping concentration of the doped polysilicon layer 207 is higher than the collector region 209, thus reducing the series resistance of the collector region 209 and the saturation voltage drop of the device; on the other hand, a good ohmic contact is formed between the doped polysilicon layer 207 and the collector electrodes 219.

Third, the optionally formed intermediate layer 206 can prevent the impurity in the doped polysilicon layer 207 from diffusing into the undoped polysilicon layer 205, thus the undoped polysilicon layer 205 is substantially an intrinsic polysilicon and is more favorable to serve as a depletion region under a reverse bias to reduce the parasitic capacitance between the doped polysilicon layer 207 and the substrate 201.

Figure 1:
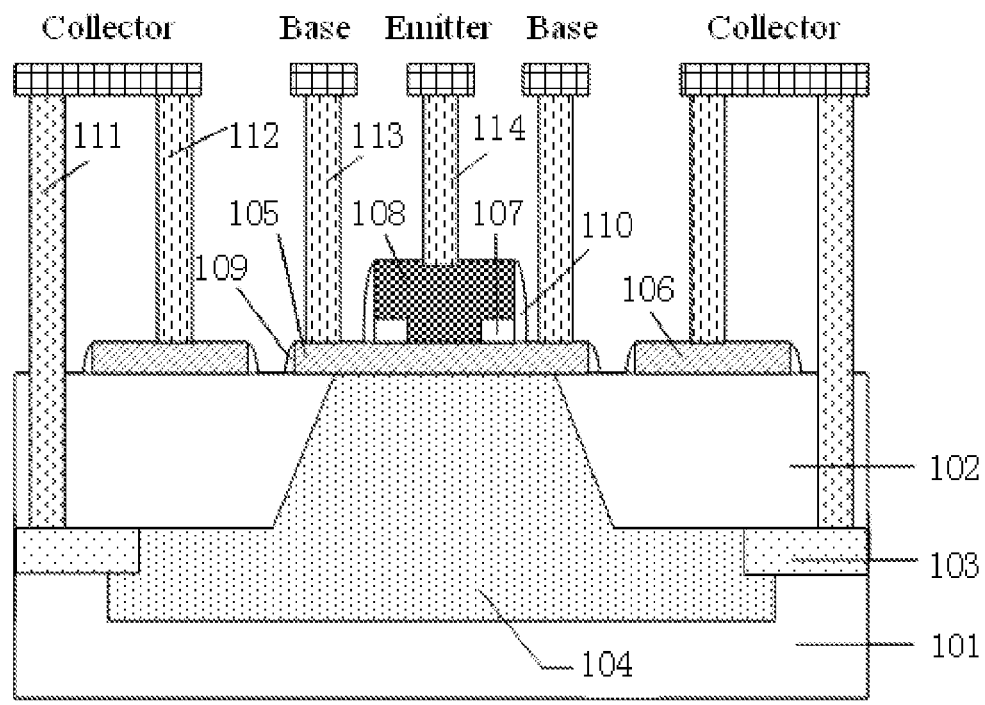
FIG. 1 is a schematic illustration of a vertical cross section of an ultra-high voltage SiGe HBT of the conventional structure.

For the ultra-high SiGe HBT of the conventional structure shown in FIG. 1, if it is assumed that: the pseudo buried layers 103 are formed by performing arsenic or phosphorus implantation with a low energy and a high dose, and the substrate 101 has a resistivity of 100 ohm·cm, then the PN junction capacitance density between the pseudo buried layers 103 and the substrate 101 will be approximately 0.05 $fF/\mu m^2$.

In one specific embodiment of the present invention, if it is assumed that: a total depth of the polysilicon stacks 300 is 3.5 μm; a depth of the undoped polysilicon layer 205 is 3 μm; and a depth of the doped polysilicon layer 207 is 0.5 μm; then the surface density of capacitance between the doped polysilicon layer 207 and the substrate 201 may be significantly reduced to 0.01 $fF/\mu m^2$, while the lateral capacitance density between the substrate 201 and the extension portion of the doped polysilicon layer 207 below the isolation region 202 is still 0.05 $fF/\mu m^2$. If a width of the doped polysilicon layer 207 is set to be twice a junction depth of a PN junction formed between the doped polysilicon layer 207 and the substrate 201, the present invention will enable the parasitic capacitance Ccs between the doped polysilicon layer 207 and the substrate 201 to be decreased by 53% (more than a half), which will greatly contribute to the improvement of RF characteristics of the ultra-high SiGe HBT.

The following table shows the comparison results of a parasitic capacitance between the conventional pseudo buried layer (formed by ions implantation at the bottom of the trench) and the substrate and a parasitic capacitance between the present structure for picking up a collector region (formed by filling polysilicon into the trench with several times) and the substrate simulated by using TCAD (Technology Computer Aided Design).

|  | Width (μm) | Trench Depth (μm) | Junction Depth (μm) | Surface Density of Capacitance ($fF/\mu m^2$) | Lateral Capacitance Density ($fF/\mu m^2$) | Total Capacitance per Unit Length ($fF/\mu m^2$) |
|---|---|---|---|---|---|---|
| Conventional Structure | 1 | none | 0.5 | 0.047 | 0.047 | 0.0705 |
| Present Structure | 1 | 2 | 0.5 | 0.01 | 0.047 | 0.0335 |

Figure 3A:
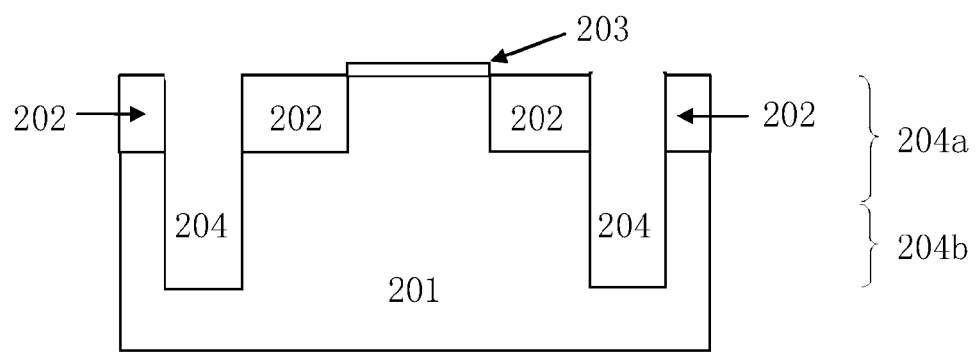
FIGS. 3a to 3k schematically illustrate device structures after steps of a method of manufacturing an ultra-high voltage SiGe HBT in accordance with the present invention.

An ultra-high voltage SiGe HBT incorporating a structure for picking up a collector region embodying the present invention may be fabricated by the following method:

In a first step, as shown in FIG. 3a, two isolation regions 202 are formed in a semiconductor substrate 201 using, for example, a local oxidation of silicon (LOCOS) process or shallow trench isolation (STI) process. The semiconductor substrate 201 may be, for example, a P-type silicon substrate.

Next, a first dielectric layer 203 serving as a temporary protective layer for an active region is formed over the surface of the substrate 201 using, for example, a thermal oxidation growth process (only can be used in the case that the first dielectric layer 203 is formed of silicon oxide), a deposition process, or a photolithography and etching process.

After that, a trench 204 is etched in each isolation region 202, the trench extending into the underlying semiconductor substrate 201. Each trench 204 comprises two portions, namely an upper portion 204a and a lower portion 204b.

Figure 3B:
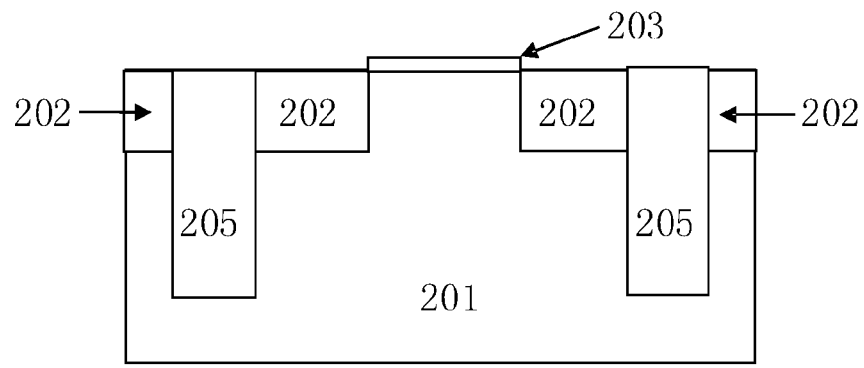

In a second step, as shown in FIG. 3b, an undoped polysilicon is deposited over the silicon substrate using, for example, a chemical vapor deposition (CVD) process. After that, the undoped polysilicon is planarized using, for example, a chemical-mechanical polishing (CMP) process, to remove its portions over the isolation regions 202 and the first dielectric layer 203, respectively. The remaining undoped polysilicon are completely filled in the trenches 204.

Figure 3C:
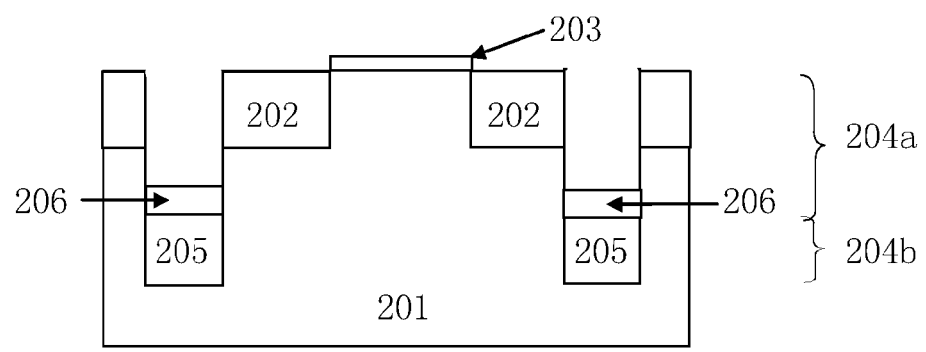

In a third step, as shown in FIG. 3c, dry etch-back process is performed to remove portions of the undoped polysilicon that are deposited in the upper portions 204a of the trenches 204, so that the upper portions 204a are emptied and each upper portion 204a has a depth that is greater than a depth of any isolation region 202. The remaining undoped polysilicon serves as the undoped polysilicon layer 205.

Next, deposit an intermediate dielectric on the substrate using, for example, a high density plasma chemical vapor deposition (HDPCVD) process, to partially fill the upper portions 204a.

After that, the intermediate dielectric is planarized to remove a portion of the intermediate dielectric located above the isolation regions 202 and the first dielectric layer 203; the remaining intermediate dielectric is totally in the upper portions 204a to serve as an intermediate layer 206 of the polysilicon stacks 300.

Figure 3D:
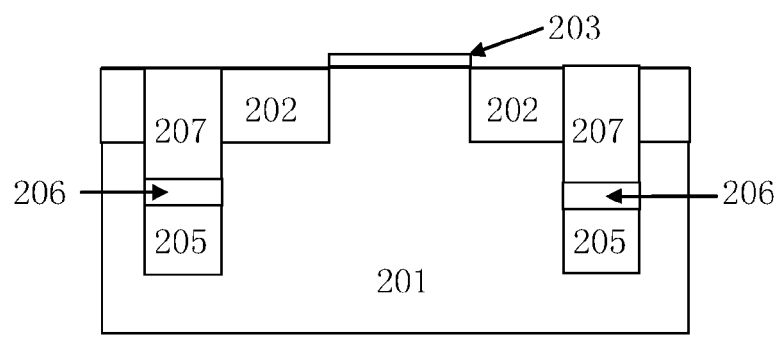

In a fourth step, as shown in FIG. 3d, a doped polysilicon is deposited over the resulting structure, at least completely filling the upper portions 204a. Moreover, the doped polysilicon is in-situ doped concurrently with, or alternatively doped by ion implantation after, its deposition, with a dopant that has an opposite conductivity type to the substrate 201. In one embodiment, the substrate 201 is doped with a P-type dopant, while the doped polysilicon is doped with an N-type dopant.

Next, the doped polysilicon is planarized to remove its portions over the isolation regions 202 and the first dielectric layer 203, respectively. The remaining portions of the doped polysilicon completely fill the upper portions 204a of the trenches 204, and each of which serves as a doped polysilicon layer 207, which is also a top layer of the polysilicon stack 300.

Figure 3E:
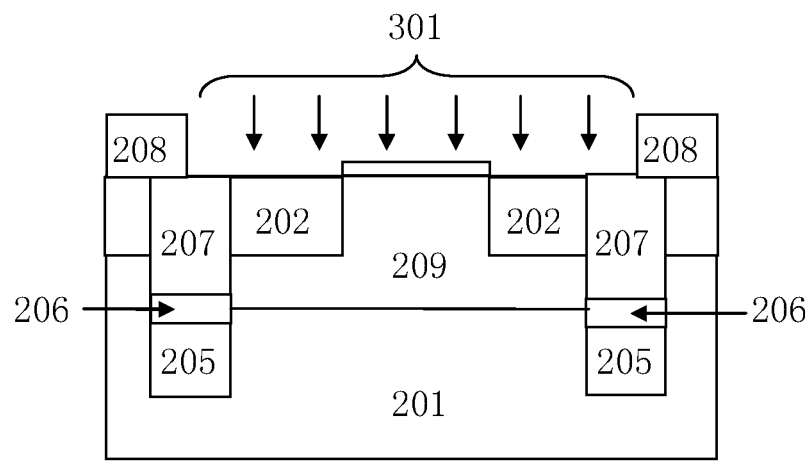

In a fifth step, as shown in FIG. 3e, a photolithography process is performed to remove a portion of a first photoresist layer 208 to expose an underlying area 301 in which a collector region described below is to be formed. The area 301 covers a portion of the substrate between the two trenches 204 and selectively covers portions of the trenches 204 as well.

After that, ions are implanted through the area 301 to form a lightly-doped collector region 209 in the portion of the substrate between the trenches 204. The ions may have an opposite conductivity type to the dopant in the substrate 201. In one embodiment, the substrate 201 is doped with a P-type dopant, while N-type ions are implanted through the area 301 to form an N-type doped collector region 209. The collector region 209 has a T-shaped vertical cross section and in contact with, on both sides, a side face of the polysilicon stacks 300. Moreover, a depth of the collector region 209 is smaller than a depth of any trench 204 and greater than a depth of the upper portion 204a of any trench 204.

Figure 3F:
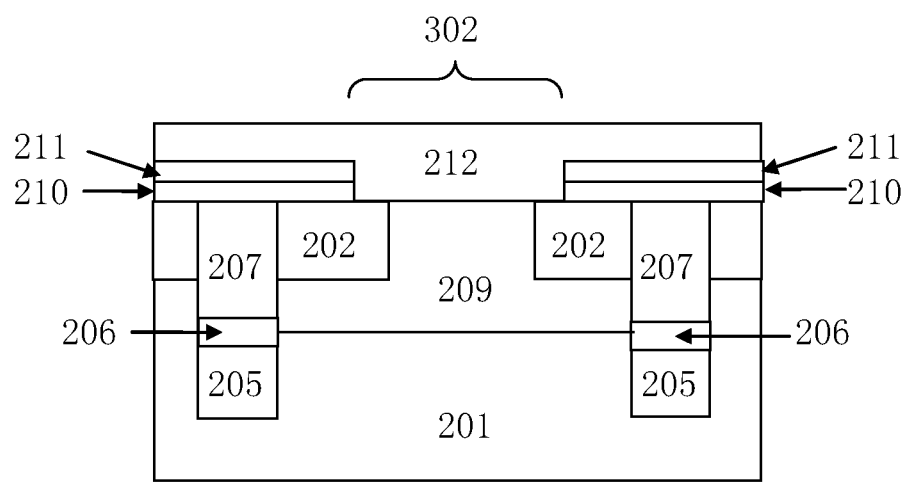

In a sixth step, as shown in FIG. 3f, the first photoresist layer 208 is removed, and a second dielectric layer 210 and a third polysilicon layer 211, for jointly forming stacks under respective opposite extending portions of a T-shaped base region described blow, are deposited over the resulting structure in this order.

Next, a base window 302 is opened in a second photoresist layer (not shown) using a photolithography process. The base window 302 totally covers the collector region 209 as well as portions of the isolation regions 202 that are adjacent to the collector region 209.

After that, an etching process is adopted to remove a portion, which is right under the base window 302, of each of the third polysilicon layer 211, the second dielectric layer 210 and the first dielectric layer 203. In this step, as the first dielectric layer 203 is entirely located under the area of the base window 302, it is completely removed.

Thereafter, a SiGe layer 212 is formed over the resulting structure, at least completely filling the base window 302. Next, the top surface of the SiGe layer 212 is planarized using a polishing process.

Figure 3G:
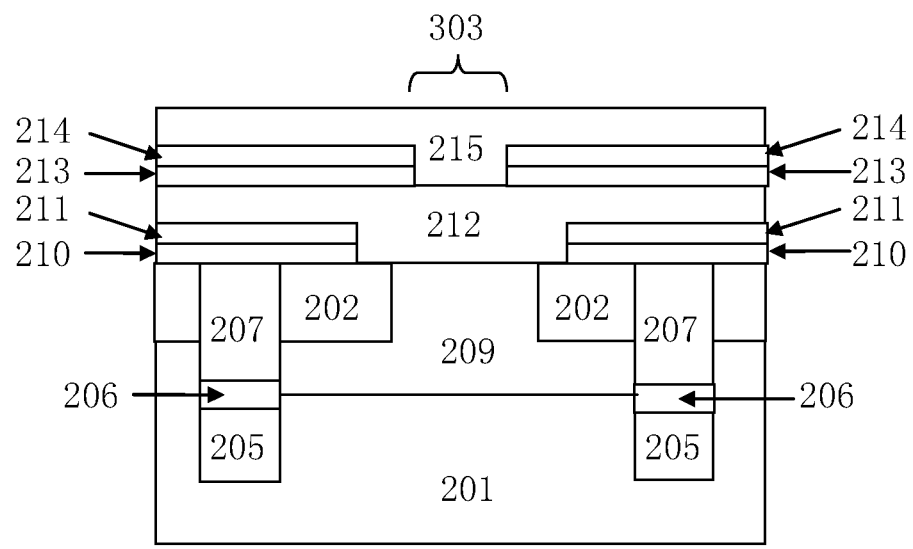

In a seventh step, as shown in FIG. 3g, a third dielectric layer 213 and a fourth dielectric layer 214, for jointly forming stacks under respective opposite extending portions of a T-shaped emitter region described blow, are deposited over the resulting structure in this order.

Next, an emitter window 303 is opened in a third photoresist layer (not shown) using a photolithography process. The emitter window 303 partially covers the collector region 209.

After that, an etching process is adopted to remove a portion, which is right below the emitter window 303, of each of the fourth dielectric layer 214 and the third dielectric layer 213.

Thereafter, fourth polysilicon 215 for forming the emitter region is deposited over the resulting structure, at least completely filling the emitter window 303. Next, the top surface of the fourth polysilicon 215 is planarized using a polishing process.

Next, the fourth polysilicon 215 is doped by ion implantation with a dopant having an opposite conductivity type to that of the substrate 201.

Figure 3H:
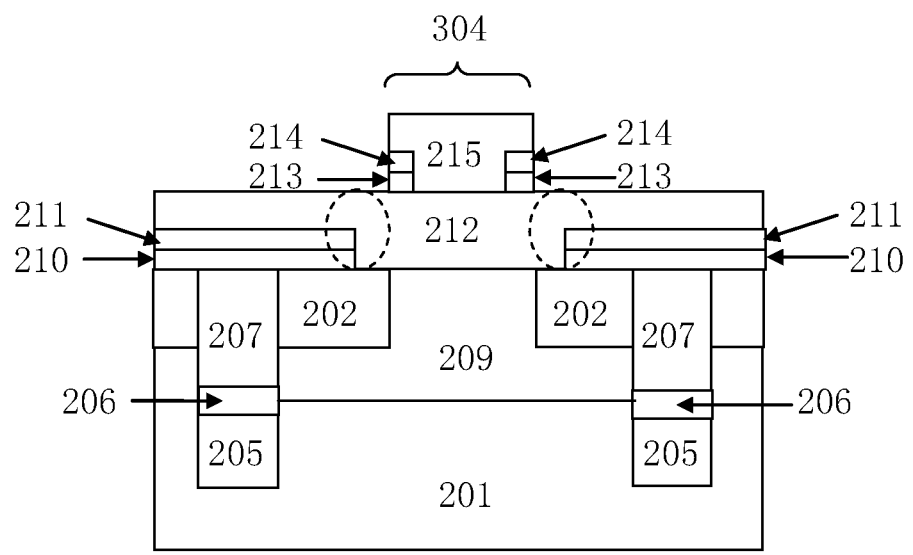

In an eighth step, as shown in FIG. 3h, other than a portion 304 under which the emitter region is to be formed, the rest portion of a fourth photoresist (not shown) is removed using a photolithography process. The portion 304 is just right above the entire area of the collector region 208.

Next, for each of the fourth polysilicon 215, the fourth dielectric layer 214 and the third dielectric layer 213, other than a portion right below the photoresist portion 304, the rest portion is removed using an etching process. Thereafter, the remaining portion of the fourth polysilicon 215 has a T-shaped vertical cross section and serves as the polysilicon emitter region 215. In addition, under each extending portion of the polysilicon emitter region 215, there appears a stack comprising remaining portions of the fourth dielectric layer 214 and the third dielectric layer 213.

After that, portions of the SiGe layer 212 that are horizontally apart from the polysilicon emitter region 215 (i.e., potions indicated by the dashed boxes in FIG. 3h, where extrinsic base regions are to be formed) is doped by ion implantation with a dopant having the same conductivity type to that of the substrate 201.

Figure 3I:
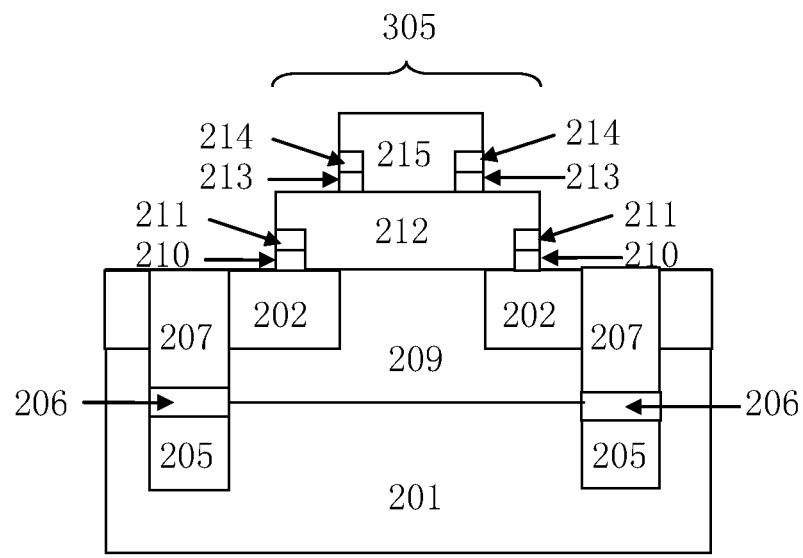

In a ninth step, as shown in FIG. 3i, other than a portion 305 under which the base region is to be formed, the rest portion of a fifth photoresist (not shown) is removed using a photolithography process. The portion 305 is just right above an area covering the entire collector region 209 as well as a portion of each isolation region 202 that is adjacent to the collector region 209.

Next, for each of the SiGe layer 212, the third polysilicon layer 211 and the second dielectric layer 210, other than a portion right below the photoresist portion 305, the rest portion is removed using an etching process. Thereafter, the remaining portion of the SiGe layer 212 has a T-shaped vertical cross section and serves as the SiGe base region 212. In addition, under each extending portion of the SiGe base region 212, there is present a stack comprising remaining portions of the third polysilicon layer 211 and the second dielectric layer 210.

Figure 3J:
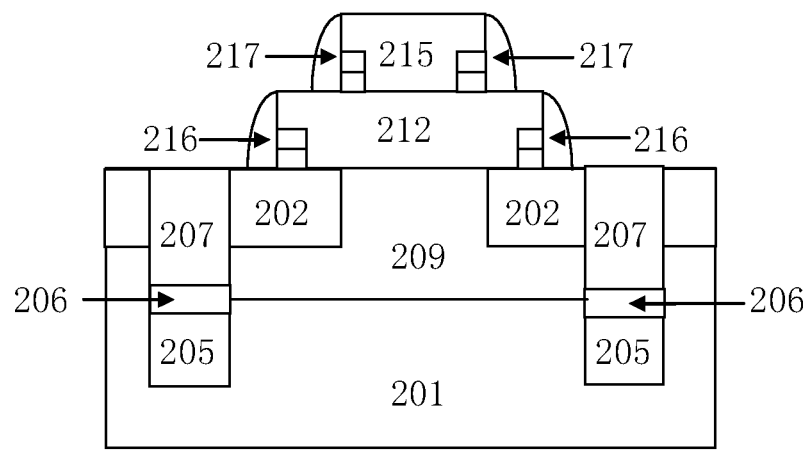

In a tenth step, as shown in FIG. 3j, a fifth dielectric layer is deposited over the resulting structure, and thereafter is etched using an etch-back process to form base-region sidewall spacers 216, each of which covers a side face of the SiGe base region 212, and emitter-region sidewall spacers 217, each of which covers a side face of the polysilicon emitter region 215.

Figure 3K:
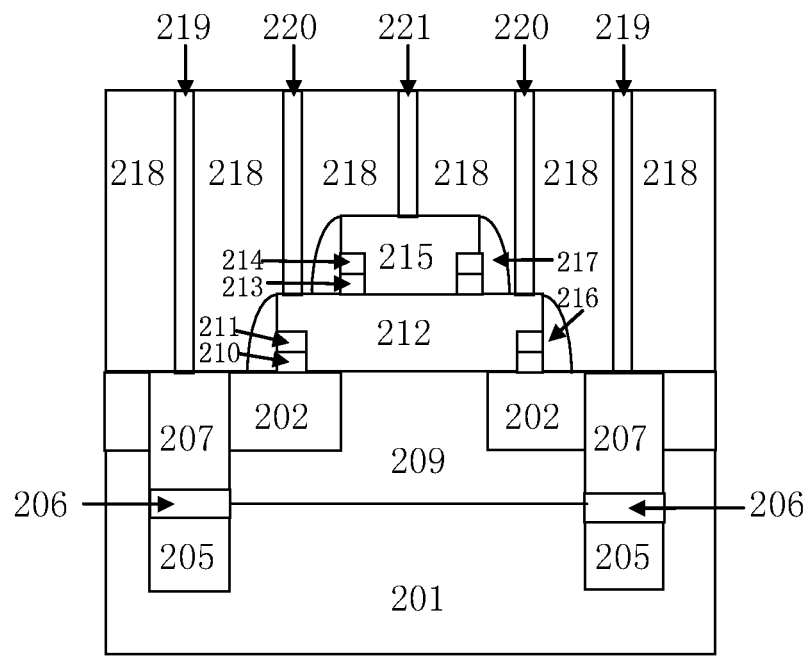

In an eleventh step, as shown in FIG. 3k, an ILD layer 218 is deposited over the resulting structure. The ILD layer 218 may be formed of borophosphosilicate glass (BPSG).

Next, a plurality of through-holes are formed in the ILD layer 218 using photolithography and etching processes, including first through-holes each having a bottom end connecting to a corresponding doped polysilicon layer 207, second through-holes each having a bottom end connecting to the SiGe base region 212, and a third through-hole having a bottom end connecting to the polysilicon emitter region 215.

After that, these through-holes are filled with conductive materials and thereafter are planarized to form collector electrodes 219, base electrodes 220 and an emitter electrode 221. This can be realized by using, for example, a tungsten plug process.

In this method, a width of the area 301 (referring to FIG. 3e)>a width of the portion 305 (referring to FIG. 3i)>a width of the base window 302 (referring to FIG. 3f)>a width of the portion 304 (referring to FIG. 3h, the width of which is substantially equal to a width of the collector region 209 at the upper edges thereof)>a width of the emitter window 303 (referring to FIG. 3g).

In the fourth step, the doped polysilicon layer 207 is preferably in-situ doped, or is alternatively doped by ion implantation after deposition of an undoped polisilicon. Preferably, the doping concentration of the doped polysilicon layer 207 is higher than $1 \times 10^{20}$ atoms/cm$^3$ to ensure an ohmic contact between the collector electrodes 219 and the doped polysilicon layer 207, a reduced series resistance of the collector region 209 and a reduced parasitic capacitance between the doped polysilicon 207 and the substrate 201. Furthermore, in the seventh step, the fourth polysilicon 215 may also be formed by in-situ doped process instead of by ion implantation process after the deposition.

In this SiGe HBT manufacturing method, the first to fifth steps as well as the eleventh step comprise a method of manufacturing a structure for picking up a collector region according to the present invention, wherein each polysilicon stack 300 comprises three stacked layers.

In case that the polysilicon stacks 300 only comprise a doped polysilicon layer 207 and an undoped polysilicon layer 205, the above method can be modified by omitting the step of depositing and planarizing an intermediate layer 206 during the third step.

While specific embodiments have been presented in the foregoing description of the invention, they are not intended to limit the invention in any way. Those skilled in the art can make various modifications and variations without departing from the scope of the invention. Thus, it is intended that the present invention covers all such modifications and variations, as well as equivalents thereof.

What is claimed is:

1. A structure for picking up a collector region, the collector region being formed in a substrate and having a core portion located between two isolation regions and a lateral portion adjacent to and underlying each of the two isolation regions, the structure comprising:
   a pair of polysilicon stacks formed in the substrate and extending downward through the isolation regions into a depth greater than a depth of the collector region, the pair of polysilicon stacks comprising an undoped polysilicon layer and a doped polysilicon layer located on the undoped polysilicon layer, the doped polysilicon layer having an opposite conductivity type to a conductivity type of the substrate; and
   a pair of collector electrodes contacting on the polysilicon stacks,
   wherein the depth of the collector region is smaller than a depth of the doped polysilicon layer and greater than a depth of the isolation regions, the doped polysilicon layer having a side face contacting with the lateral portion of the collector region.

2. The structure according to claim 1, further comprising an intermediate layer formed between the undoped polysilicon layer and the doped polysilicon layer.

3. The structure according to claim 1, wherein the doped polysilicon layer has a depth great enough to ensure a low parasitic capacitance between the doped polysilicon layer and the substrate.

4. The structure according to claim 2, wherein the doped polysilicon layer has a depth great enough to ensure a low parasitic capacitance between the doped polysilicon layer and the substrate.

5. A method of manufacturing the structure for picking up a collector region according to claim 1, the method comprising:
   forming two isolation regions in a substrate, the isolation regions isolating an active region therebetween;
   forming a trench through each of the isolation regions, each trench extending below the isolation regions;
   depositing an undoped first polysilicon to completely fill the trenches;
   removing a portion of the first polysilicon in an upper portion of each trench so that the remaining first polysilicon serves as the undoped polysilicon layer;
   depositing a second polysilicon to form the doped polysilicon layer in the upper portion of each trench;
   forming a collector region between the two isolation regions, both sides of the collector region contacting a first side face of the doped polysilicon layer, a depth of the collector region being smaller than a depth of the doped polysilicon layer and greater than a depth of the isolation regions; and
   forming collector electrodes contacting on the doped polysilicon layer.

6. The method according to claim 5, wherein the second polysilicon is in-situ doped with a dopant that has an opposite conductivity type to the substrate during the process of depositing the second polysilicon.

7. The method according to claim 5, wherein the second polysilicon is doped by ion implantation with a dopant that has an opposite conductivity type to the substrate after the second polysilicon is deposited.

8. A method of manufacturing the structure for picking up a collector region according to claim 2, the method comprising:
   forming two isolation regions in a substrate, the isolation regions isolating an active region therebetween;
   forming a trench through each of the isolation regions, each trench extending below the isolation regions;

depositing an undoped first polysilicon to completely fill the trenches;

removing a portion of the first polysilicon in an upper portion of each trench so that the remaining first polysilicon serves as the undoped polysilicon layer;

depositing an intermediate dielectric layer in the trenches to form an intermediate layer;

depositing a second polysilicon to completely fill the trenches to form the doped polysilicon layer in the upper portion of each trench;

forming a collector region between the two isolation regions, both sides of the collector region contacting a first side face of the doped polysilicon layer, a depth of the collector region being smaller than a depth of the doped polysilicon layer and greater than a depth of the isolation regions; and forming collector electrodes contacting on the doped polysilicon layer.

9. The method according to claim 8, wherein the second polysilicon is in-situ doped with a dopant that has an opposite conductivity type to the substrate during the process of depositing the second polysilicon.

10. The method according to claim 8, wherein the second polysilicon is doped by ion implantation with a dopant that has an opposite conductivity type to the substrate after the second polysilicon is deposited.

* * * * *